(12) United States Patent
Chien et al.

(10) Patent No.: US 9,761,656 B2
(45) Date of Patent: Sep. 12, 2017

(54) SEMICONDUCTOR DEVICE HAVING BURIED REGION AND METHOD OF FABRICATING SAME

(71) Applicant: Macronix International Co., Ltd., Hsinchu (TW)

(72) Inventors: Yu-Chin Chien, Taipei (TW); Ching-Lin Chan, Huwei Township (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/683,710

(22) Filed: Apr. 10, 2015

(65) Prior Publication Data

US 2016/0300903 A1    Oct. 13, 2016

(51) Int. Cl.
| H01L 29/66 | (2006.01) |
| H01L 29/06 | (2006.01) |
| H01L 29/739 | (2006.01) |
| H01L 29/861 | (2006.01) |
| H01L 29/78 | (2006.01) |
| H01L 29/10 | (2006.01) |

(52) U.S. Cl.
CPC ........ *H01L 29/063* (2013.01); *H01L 29/0634* (2013.01); *H01L 29/66325* (2013.01); *H01L 29/66689* (2013.01); *H01L 29/7393* (2013.01); *H01L 29/7816* (2013.01); *H01L 29/8618* (2013.01); *H01L 29/1087* (2013.01)

(58) Field of Classification Search
CPC ............. H01L 29/1095; H01L 29/7816; H01L 29/66681; H01L 29/0623; H01L 29/063
See application file for complete search history.

(56) References Cited

U.S. PATENT DOCUMENTS

| 6,207,994 B1 * | 3/2001 | Rumennik | H01L 21/26 257/339 |
| 2010/0140700 A1 * | 6/2010 | Lee | H01L 29/0634 257/343 |
| 2012/0175673 A1 * | 7/2012 | Lee | H01L 27/0277 257/140 |
| 2012/0280316 A1 * | 11/2012 | Lin | H01L 29/66689 257/335 |
| 2015/0270388 A1 * | 9/2015 | Chan | H01L 29/1087 257/343 |

* cited by examiner

*Primary Examiner* — Khiem D Nguyen
(74) *Attorney, Agent, or Firm* — Finnegan, Henderson, Farabow, Garrett & Dunner LLP

(57) ABSTRACT

A semiconductor device includes a substrate having a first conductivity type, a high-voltage well having a second conductivity type and formed in the substrate, a drift region formed in the high-voltage well, a drain region formed in the high-voltage well and spaced apart from the drift region, and a buried region having the first conductivity type formed in the high-voltage well between the drift region and the drain region.

20 Claims, 13 Drawing Sheets

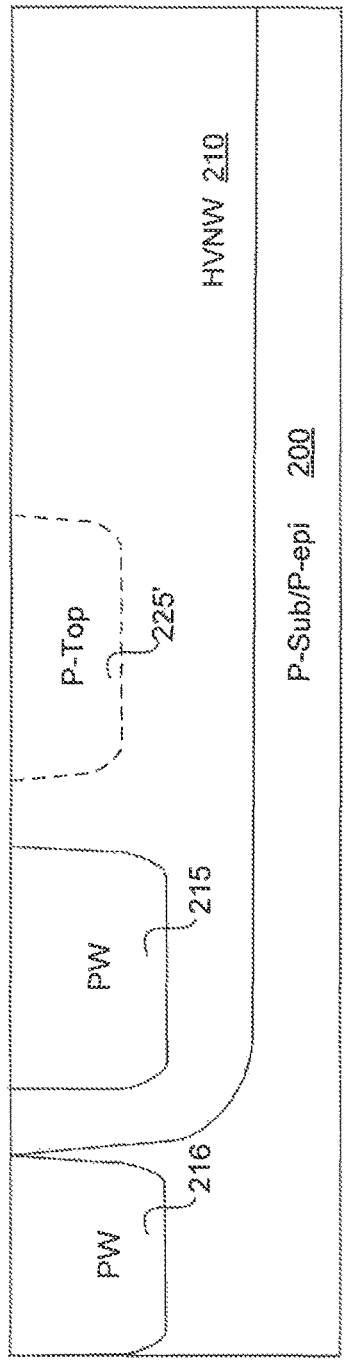
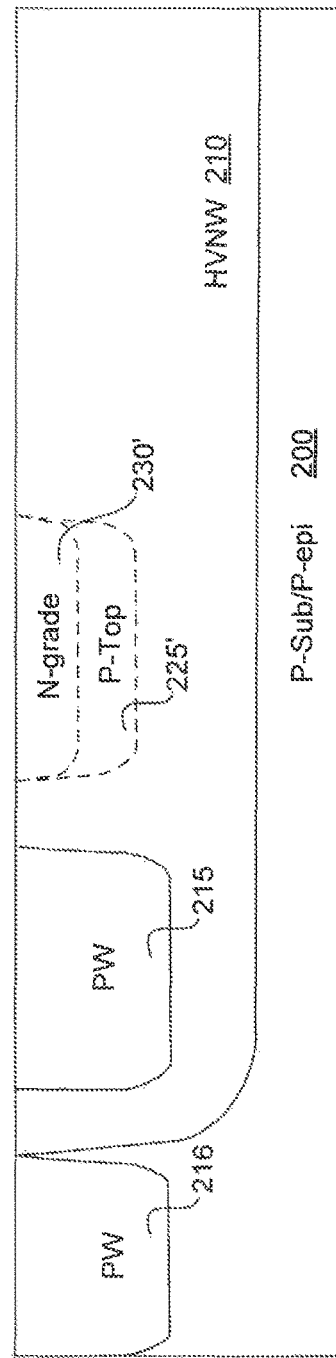
FIG. 2C
FIG. 2D

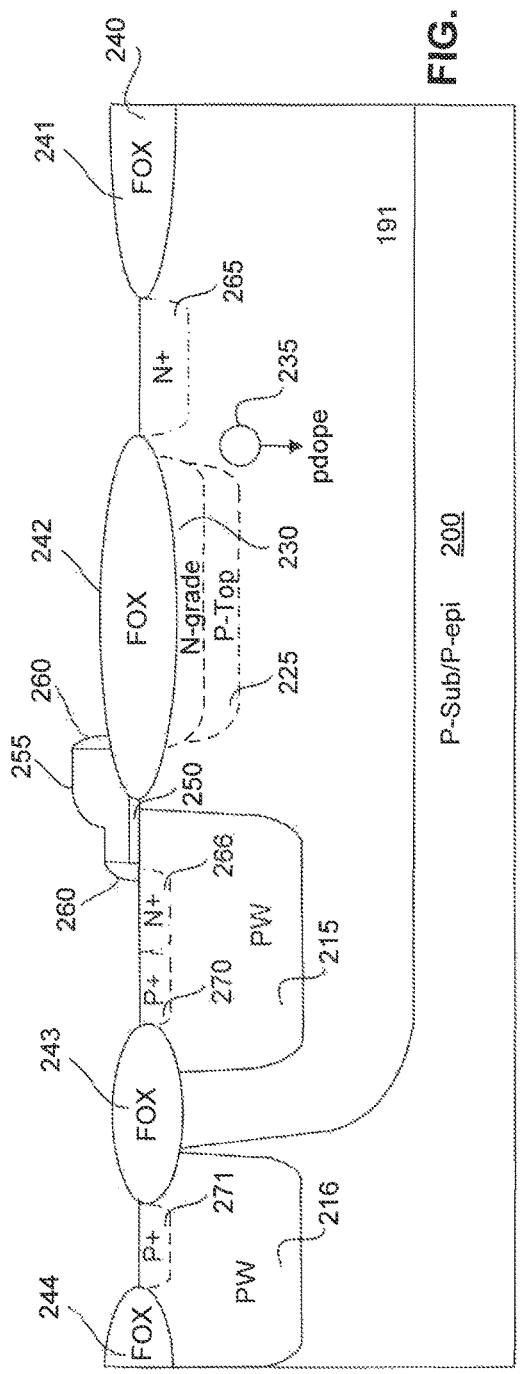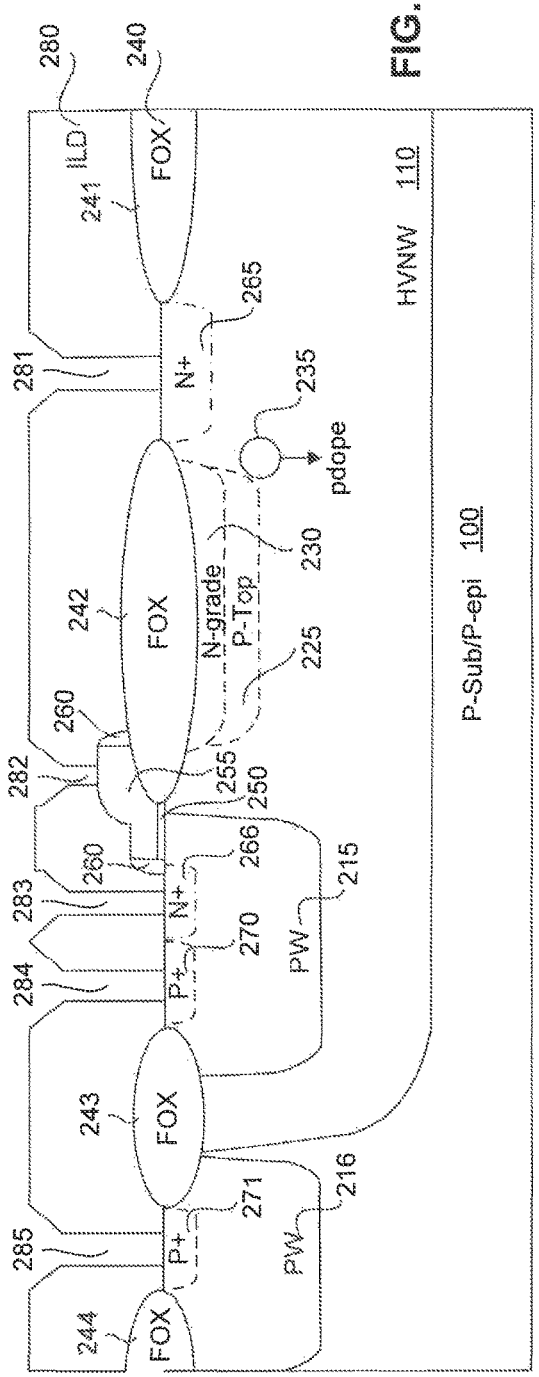

SEMICONDUCTOR DEVICE HAVING BURIED REGION AND METHOD OF FABRICATING SAME

FIELD OF THE DISCLOSURE

The present disclosure relates to a semiconductor device and a method of fabricating the same and, more particularly, to a semiconductor device having a buried region and a method of fabricating the same.

BACKGROUND OF THE DISCLOSURE

Ultra-high voltage (ultra-HV) semiconductor devices are widely used in display devices, portable devices, and many other applications. Design goals of the ultra-HV semiconductor devices include high breakdown voltage, and low specific on-resistance. The specific on-resistance of the ultra-HV semiconductor device is limited by an interaction between an n-grade region and a p-top rejection of the device.

SUMMARY

According to an embodiment of the disclosure, a semiconductor device includes a substrate having a first conductivity type, a high-voltage well having a second conductivity type and formed in the substrate, a drift region formed in the high-voltage well, a drain region formed in the high-voltage well and spaced apart from the drift region, and a buried region having the first conductivity type formed in the high-voltage well between the drift region and the drain region.

According to another embodiment of the disclosure, a method for fabricating a semiconductor device is provided. The method includes providing a substrate having a first conductivity type, forming a high-voltage well having a second conductivity type in the substrate, forming a drift region in the high-voltage well, forming a drain region in the high-voltage well and spaced apart from the drift region, and forming a buried region having the first conductivity type in the high-voltage well between the drift region and the drain region.

The accompanying drawings, which are incorporated in and constitute a part of this specification, illustrate disclosed embodiments and, together with the description, serve to explain the disclosed embodiments.

BRIEF DESCRIPTION OF THE DRAWINGS

FIGS. 2A-2M schematically illustrate a process of fabricating the device of FIG. 1, according to an illustrated embodiment.

DETAILED DESCRIPTION

Reference will now be made in detail to the present embodiments, examples of which are illustrated in the accompanying drawings. Wherever possible, the same reference numbers will be used throughout the drawings to refer to the same or like parts.

Figure 1:
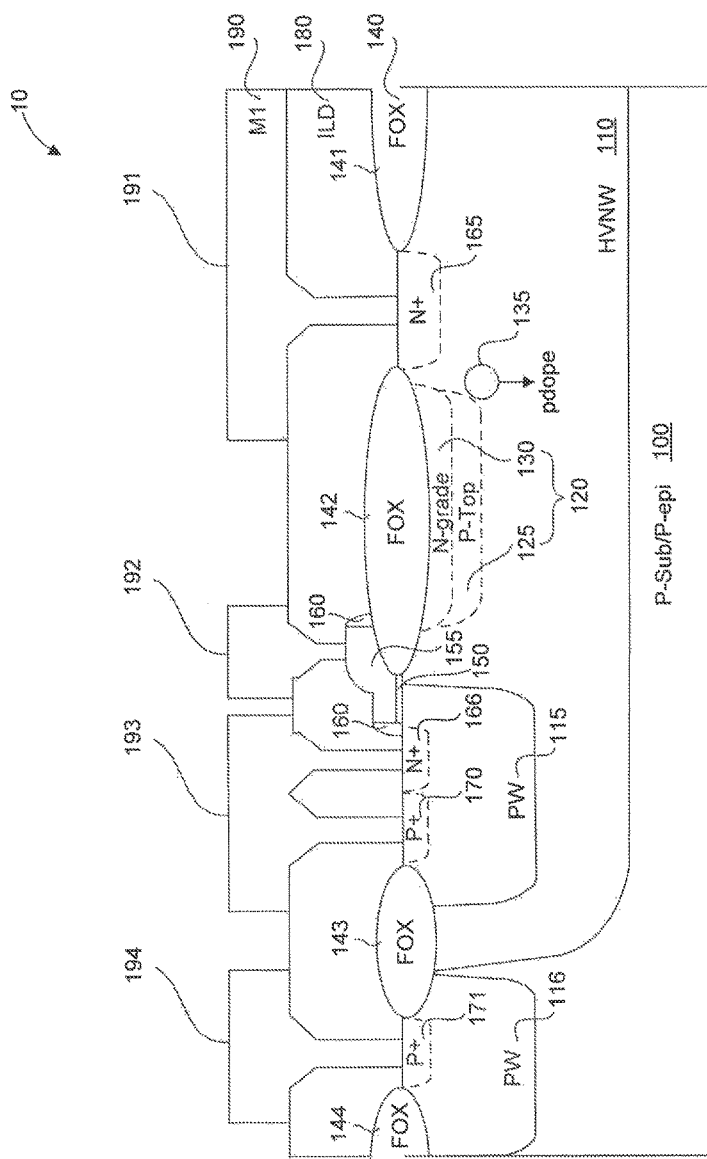
FIG. 1 schematically illustrates a cross-sectional view of an ultra-high voltage semiconductor device, according to an embodiment.

FIG. 1 schematically illustrates a cross-sectional view of an ultra-HV semiconductor device 10 (hereinafter referred to as "device 10"), according to an illustrated embodiment. Device 10 is an N-type lateral diffused metal oxide semiconductor (LDMOS) device. As illustrated in FIG. 1, device 10 includes a P-type substrate (P-sub/P-epi) 100, and a high-voltage N-well (HVNW) 110 formed in substrate 100. Substrate 100 can be formed of a P-type bulk silicon material, a P-type epitaxial layer, or a P-type silicon-on-insulator (SOD) material. A first P-well (PW) 115 is formed in HVNW 110 and spaced apart from a left-side edge of HVNW 110. First PW 115 constitutes a source well of device 10. A second PW 116 is formed outside and adjacent to the left-side edge of HVNW 110. Second PW 116 constitutes a bulk well of device 10. A drift region 120 is formed in HVNW 110 and spaced apart from a right-side edge of first PW 115. Drift region 120 includes a P-top region 125 and an N-grade region 130 formed above P-top region 125. An insulation layer 140 is formed above substrate 100. Insulation layer 140 can be made of field oxide (FOX). Hereinafter, insulation layer 140 is referred to as FOX layer 140. FOX layer 140 includes a first FOX portion 141 covering a right portion of HVNW 110, a second FOX portion 142 covering drift region 120, a third FOX portion 143 covering a left-side edge portion of HVNW 110 between first PW 115 and second PW 116, and a fourth FOX portion 144 covering a left-side edge portion of second PW 116. A gate oxide layer 150 is formed above a right-side edge portion of first PW 115. A gate layer 155 is formed above gate oxide layer 150. Spacers 160 are formed on side walls of gate layer 155. A first $N^+$-region 165 is formed in HVNW 110 and spaced apart from a right-side edge of drift region 120. First $N^+$-region 165 constitutes a drain region of device 10. A second $N^+$-region 166 is formed in first PW 115 adjacent to a left-side edge of gate layer 155. A first $P^+$-region 170 is formed in first PW 115 and adjacent to a left-side edge of second $N^+$-region 166. Second $N^+$-region 166 and first $P^+$-region 170 together constitute a source region of device 10. A second $P^+$-region 171 is formed in second PW 116 and constitutes a bulk region of device 10. An interlayer dielectric (ILD) layer 180 is formed above substrate 100. A contact layer 190 provided, for example, as a metal layer (M1), is formed above ILD layer 180. Contact layer 190 includes a plurality of isolated contact portions for conductively contacting different portions of the structures formed in substrate 100 via different openings formed in ILD layer 180. Specifically, contact layer 190 includes a first contact portion 191 that conductively contacts first $N^+$-region 165, a second contact portion 192 that conductively contacts gate layer 155, a third contact portion 193 that conductively contacts second $N^+$-region 166 and first $P^+$-region 170, and a fourth contact portion 194 that conductively contacts second $P^+$-region 171. Additional ILD layers and contact layers can be formed above substrate 100.

Device 10 also includes a P-type buried region (hereinafter referred to as "pdope region") 135 formed between drift region 120 and first N+-region 165 which constitutes the drain region of device 10, and close to a bottom of drift region 120. In an ultra-HV device formed without pdope region 135, a maximum doping concentration in N-grade region 130 is limited by a doping concentration in P-top region 125. Thus, it is difficult for the ultra-HV device to achieve a high breakdown voltage and a low specific on-resistance. On the other hand, device 10 according to the illustrated embodiment includes pdope region 135 between drift region 120 and first N+-region 165 to assist in formation of a full depletion region. As a result, a doping concentration in P-top region 125 can be decreased, or a doping concentration in N-grade region 130 can be increased, which has the effect of reducing the specific on-resistance of device 10.

FIGS. 2A-2M schematically illustrate a process of fabricating device 10 of FIG. 1, according to an illustrated embodiment.

Figure 2A:
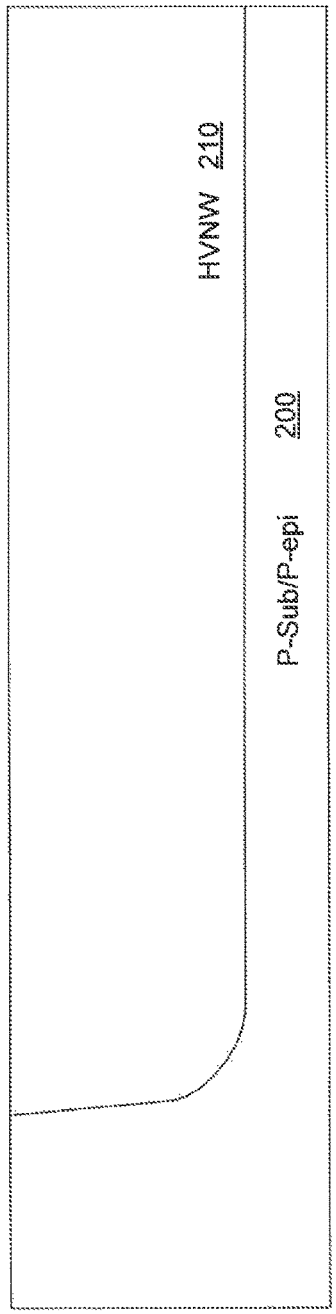

First, referring to FIG. 2A, a P-type substrate (P-sub/P-epi) 200 is provided. Substrate 200 can be formed of a P-type bulk silicon material, a P-type epitaxial layer, or a P-type silicon-on-insulator (501) material. A HVNW 210 is formed in substrate 200 and extending downward from a top surface of substrate 200. HVNW 210 is formed by a photolithography process that defines a region in substrate 200 in which HVNW 210 is to be formed, an ion implantation process for implanting an N-type dopant (e.g., phosphorus or arsenic) into the defined region, and a heating process for driving-in the implanted dopant.

Figure 2B:
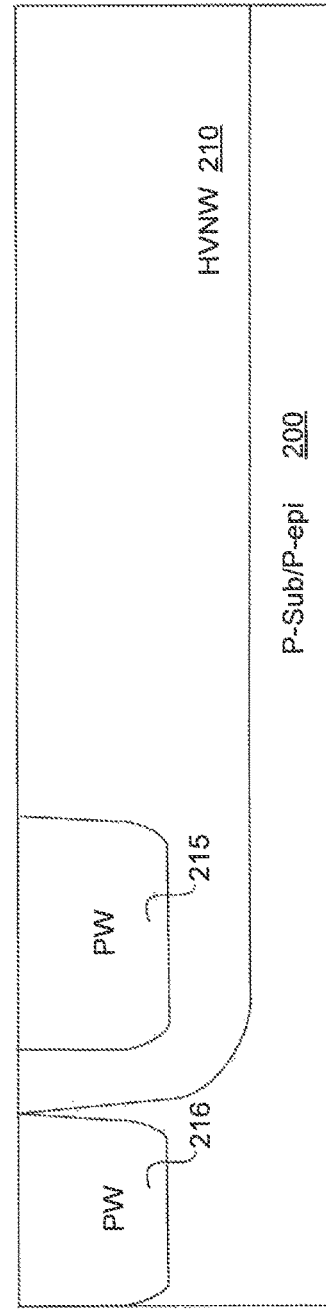

Referring to FIG. 2B, a first P-well (PW) 215 is formed in HVNW 210, close to a left-side edge portion of HVNW 210. A second PW 216 is formed in substrate 200, outside and adjacent to the edge portion of HVNW 210. First PW 215 and second PW 216 are formed by a photolithography process that defines regions in which first PW 215 and second PW 216 are to be formed, an ion implantation process for implanting a P-type dopant (e.g., boron) into the defined regions, and a heating process for driving-in the implanted dopant to reach a predetermined depth.

Referring to FIG. 2C, a P-top implantation region 225' is formed in HVNW 210, extending downward from a top surface of HVNW 210. P-top implantation region 225' is disposed on a right-side of first PW 215, and is further away from the left-side edge portion of HVNW 210 compared to first PW 215. P-top implantation region 225 is formed by a photolithography process that defines a region in which P-top implantation region 225' is to be formed, and an ion implantation process for implanting a P-type dopant (e.g., boron) into the defined region.

Referring to FIG. 2D, an N-grade implantation region 230' is formed in HVNW 210, extending downward from the top surface of HVNW 210, and vertically (along a thickness direction of substrate 200) aligned with P-top implantation region 225. N-grade implantation region 230' is formed by a photolithography process that defines a region in which N-grade implantation region 230' is to be formed, and an ion implantation process for implanting an N-type dopant (e.g., phosphorus or arsenic) into the defined region. A depth of P-top implantation region 225' is larger than a depth of N-grade implantation region 230'.

Figure 2E:
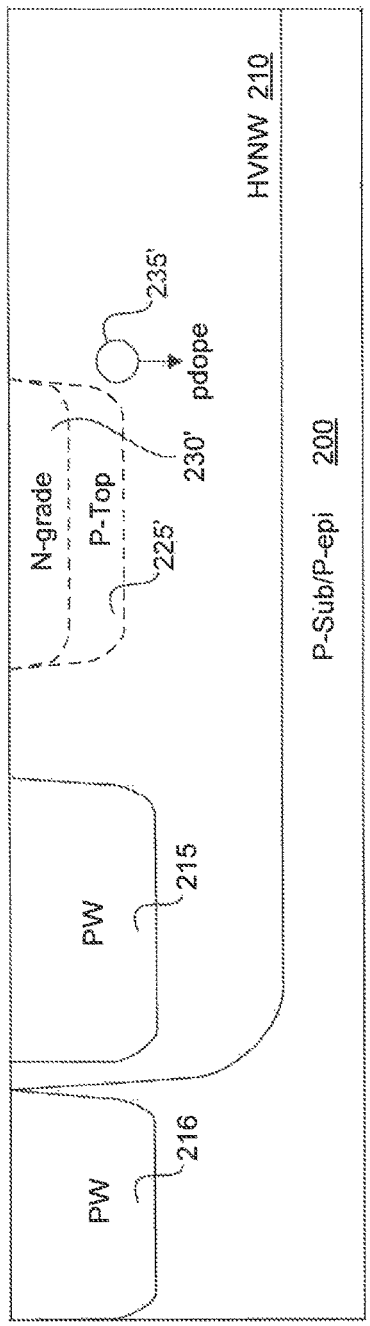

Referring to FIG. 2E, a P-type buried implantation region 235' is formed in HVNW 210, and close to a lower right-side edge of P-top implantation region 225', and is further away from first PW 215 compared to P-top implantation region 225'. P-type buried implantation region 235' can be formed by a photolithography process that defines a region in which P-type buried implantation region 235' is to be formed, and an ion implantation process for implanting a P-type dopant (e.g., boron) into the defined region. An implantation energy and implantation dosage for forming P-type buried implantation region 235' are variables determined in view of various design considerations. The implantation energy for the ion implantation process for forming P-type buried implantation region 235' is greater than an implantation energy for the ion implantation process for forming P-top implantation region 225' and an implantation energy for the ion implantation process for forming N-grade implantation region 230', such that P-type buried implantation region 235' is buried inside HVNW 210, instead of being formed in the surface of HVNW 210.

Figure 2F:
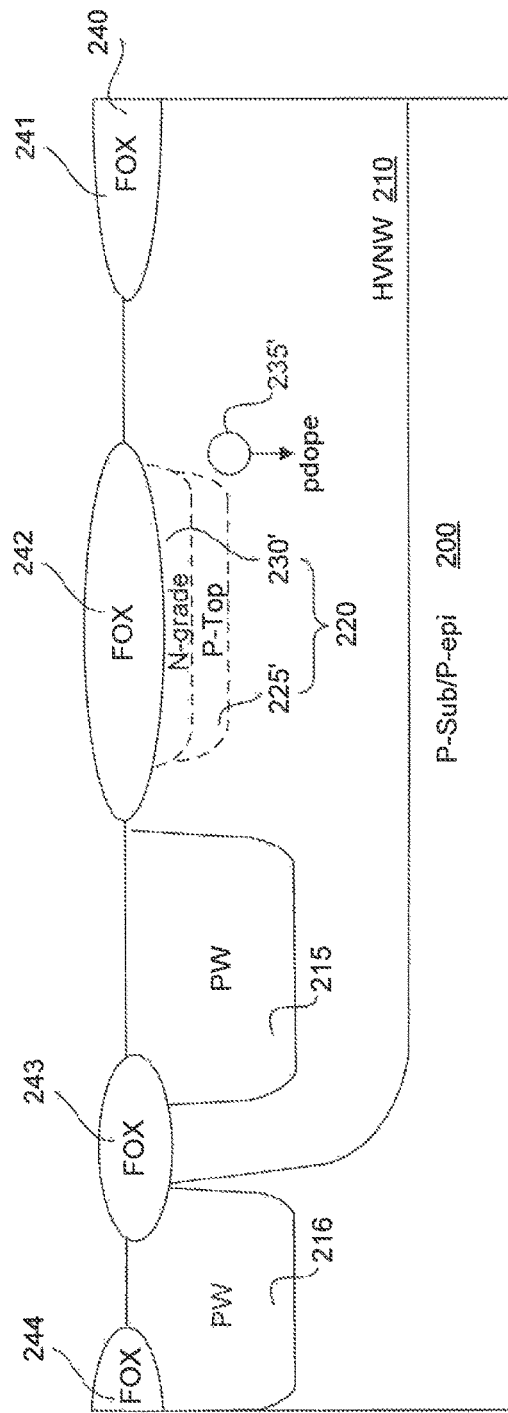

Referring to FIG. 2F, an insulation layer in the form of a field oxide (FOX) layer 240 is formed above the surface of substrate 200. FOX layer 240 includes a first FOX portion 241 covering a right portion of HVNW 210, a second FOX portion 242 covering P-top implantation region 225' and N-grade implantation region 230', a third FOX portion 243 covering the left-side edge portion of HVNW 210 between first PW 215 and second PW 216, and a fourth FOX portion 244 covering a left-side edge portion of second PW 216. FOX layer 240 is formed by a deposition process that deposits, e.g., a silicon nitride layer, a photolithography process that defines regions where FOX layer 240 is to be formed, an etching process that removes the silicon nitride layer in the defined regions, and a thermal oxidation process that forms FOX layer 240 in the defined regions. During the thermal oxidation process for forming FOX layer 240, the P-type dopant in P-top implantation region 225', the N-type dopant in N-grade implantation region 230', and the P-type dopant in P-type buried implantation region 235' are driven to predetermined depths in HVNW 210 to form a P-top region 225', an N-grade region 230', and a pdope region 235', respectively. P-top region 225' and N-grade region 230' together constitute a drift region 220.

Figure 2G:
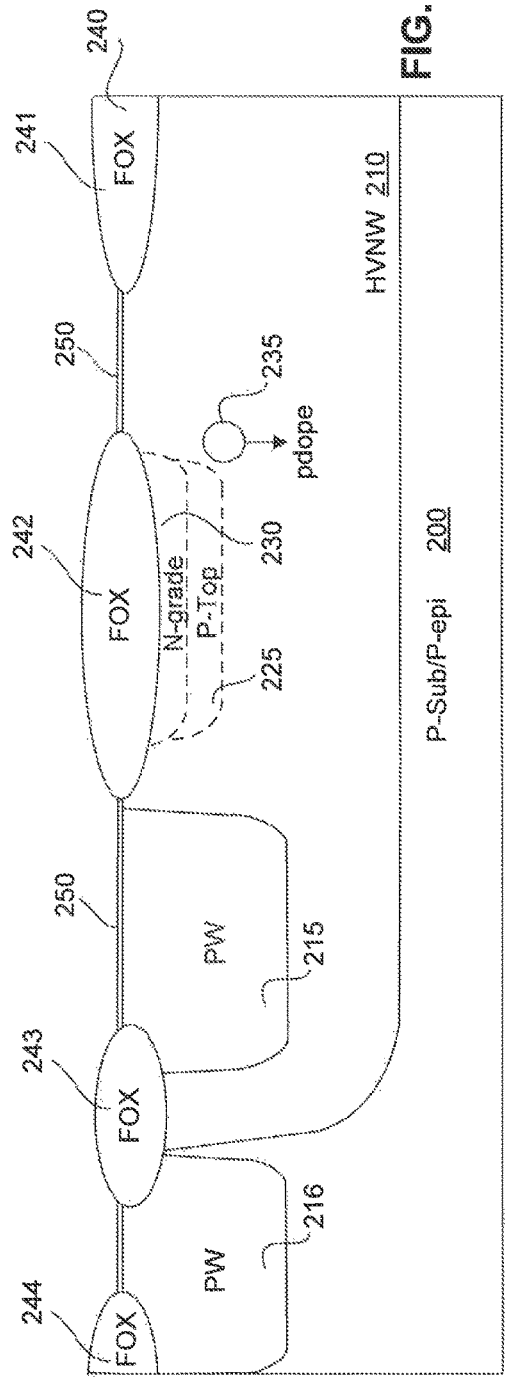

Referring to FIG. 2G, a gate oxide layer 250 is formed above surface portions of the structure of FIG. 2F that are not covered by FOX layer 240. That is, gate oxide layer 250 is formed between first FOX portion 241 and second FOX portion 242, between second FOX portion 242 and third FOX portion 243, and between third FOX portion 243 and fourth FOX portion 244. Gate oxide layer 250 is formed by a sacrificial oxidation process to form a sacrificial oxide layer, a cleaning process to remove the sacrificial oxide layer, and an oxidation process to form gate oxide layer 250.

Figure 2H:
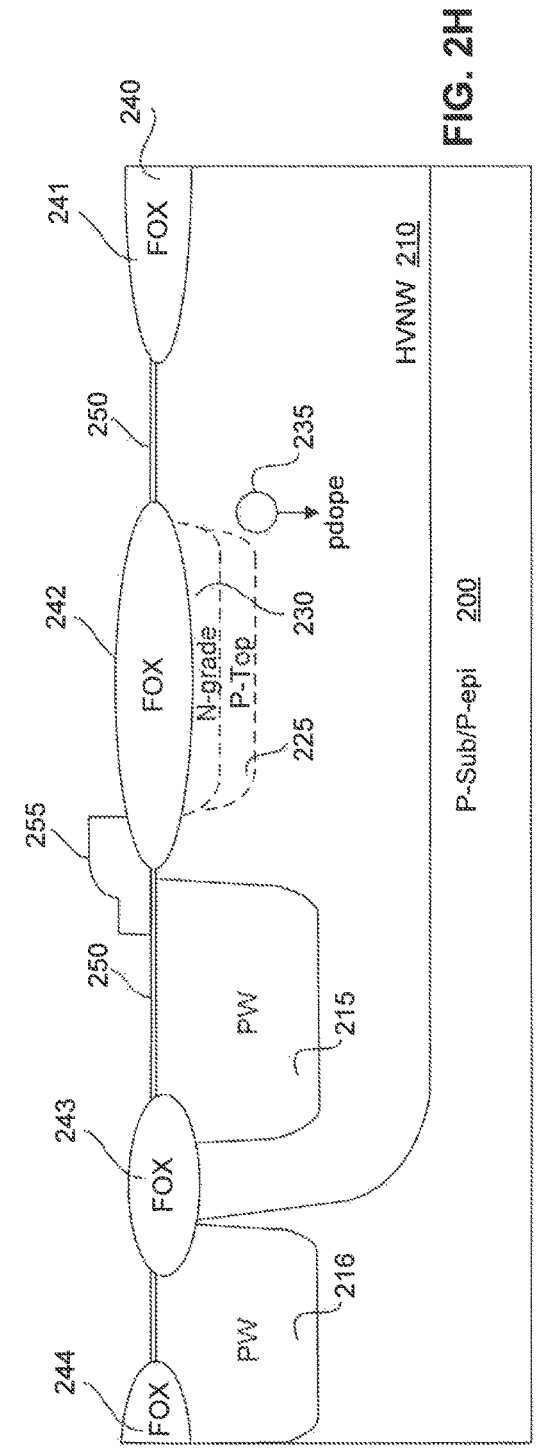

Referring to FIG. 2H, a gate layer 255 is formed above gate oxide layer 250, overlying a left portion of second FOX portion 242 and a right portion of first PW 215. Gate layer 255 can include, e.g., a polysilicon layer and a tungsten silicide layer formed above the polysilicon layer. Gate layer 255 is formed by a deposition process for depositing a polysilicon layer and a tungsten silicide layer over the entire substrate, a photolithography process that defines a region where gate layer 255 is to be formed, and an etching process that removes the polysilicon layer and the tungsten silicide layer outside the defined region.

Figure 2I:
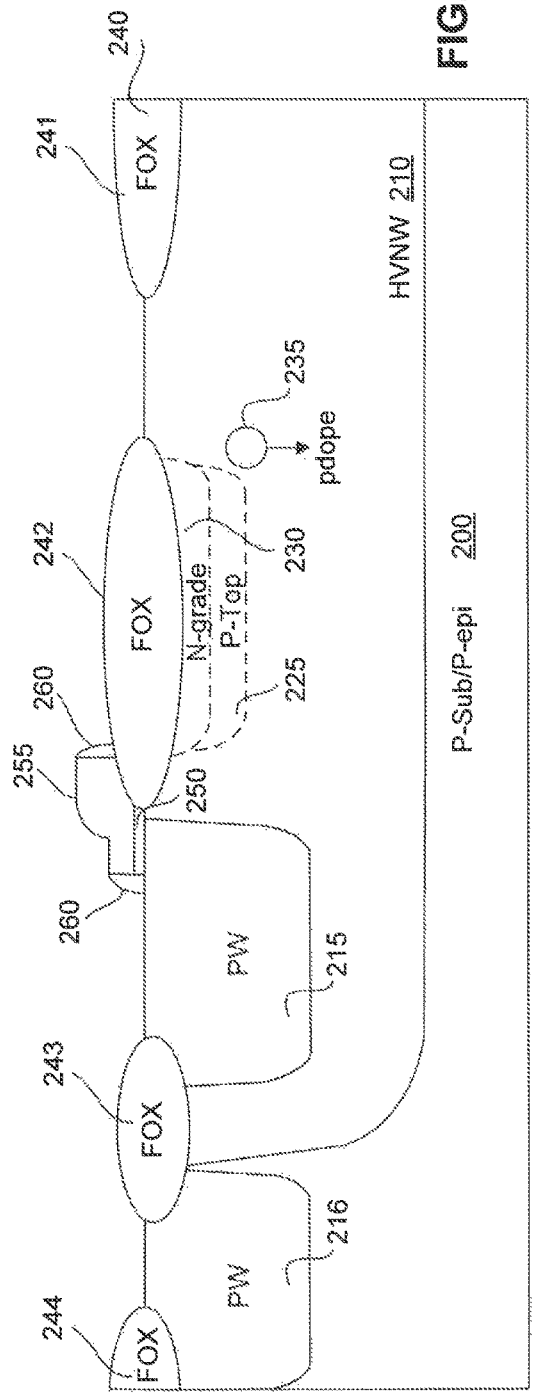

Referring to FIG. 2I, spacers 260 are formed on both sides of gate layer 255. Spacers 260 are formed of, e.g., tetraethoxysilane (TEOS) oxide films. Spacers 260 are formed by a deposition process that deposits the TEOS oxide film, a photolithography process that defines regions where spacers 260 are to be formed, and an etching process that removes the TEOS oxide film outside the defined regions.

After spacers 260 are formed, gate oxide layer 250, except for the portion under gate layer 255 and spacers 260, is removed by etching.

Figure 2J:
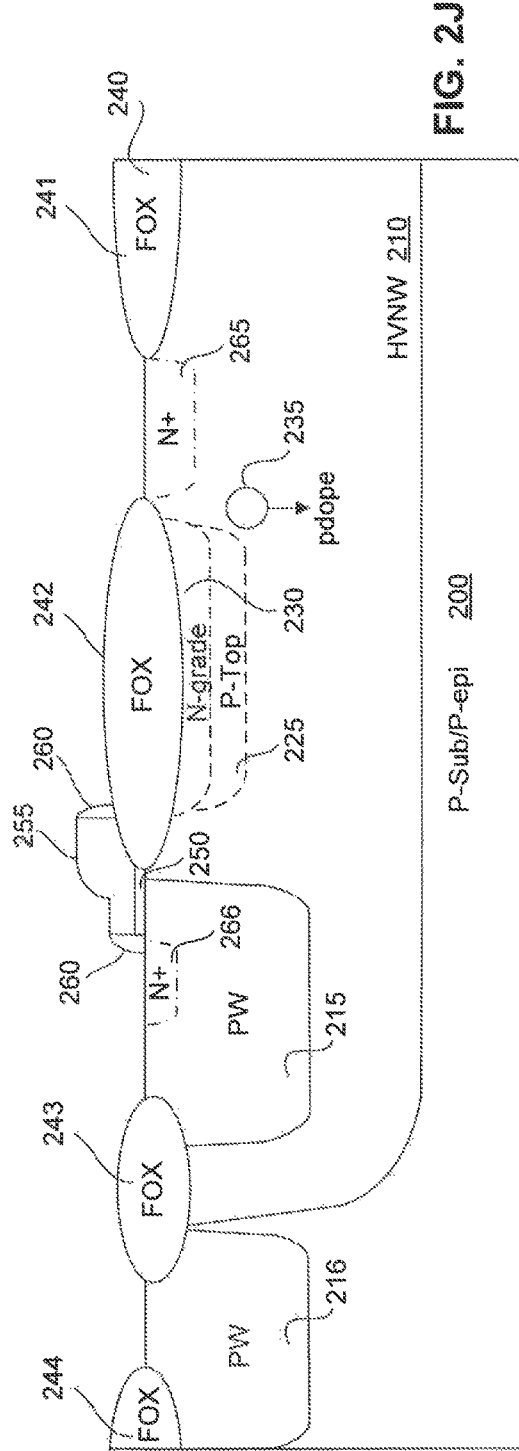

Referring to FIG. 2J, a first N+-region 265 is formed in HVNW 210 between first FOX portion 241 and second FOX portion 242, and a second N+-region 266 is formed in first PW 215 adjacent to a left-side edge portion of gate layer 255 and under a left-side spacer 260. First N+-region 265 and second N+-region 266 are formed by a photolithography process that defines regions where first N+-region 265 and second N+-region 266 are to be formed, and an ion implantation process for implanting a N-type dopant (e.g., phosphorus or arsenic) into the defined regions.

Referring to FIG. 2K, a first P+-region 270 is formed in first PW 215 adjacent to second N+-region 266, and a second P+-region 271 is formed in second PW 216 between third FOX portion 243 and fourth FOX portion 244. First P+-region 270 and second P+-region 271 are formed by a photolithography process that defines regions where first P+-region 270 and second P+-region 271 are to be formed, and an ion implantation process for implanting a P-type dopant (e.g., boron) into the defined regions.

Referring to FIG. 2L, an interlayer dielectric (ILD) layer 280 is formed above the entire surface of the structure of FIG. 2K. ILD layer 280 includes a first opening 281 that is vertically aligned with first N+-region 265, a second opening 282 that is vertically aligned with gate layer 255, a third opening 283 that is vertically aligned with second N+-region 266, a fourth opening 284 that is vertically aligned with first P+-region 270, and a fifth opening 285 that is vertically aligned with second P+-region 271. ILD layer 280 can include undoped silicate glass (USG) and/or borophosphosilicate glass (BPSG). ILD layer 280 is formed by a deposition process for depositing a layer of USG and/or BPSG, a photolithography process that defines regions where ILD layer 280 is to be formed, and an etching process that removes the layer of USG and/or BPSG outside the defined regions for forming openings 281 through 285.

Figure 2M:
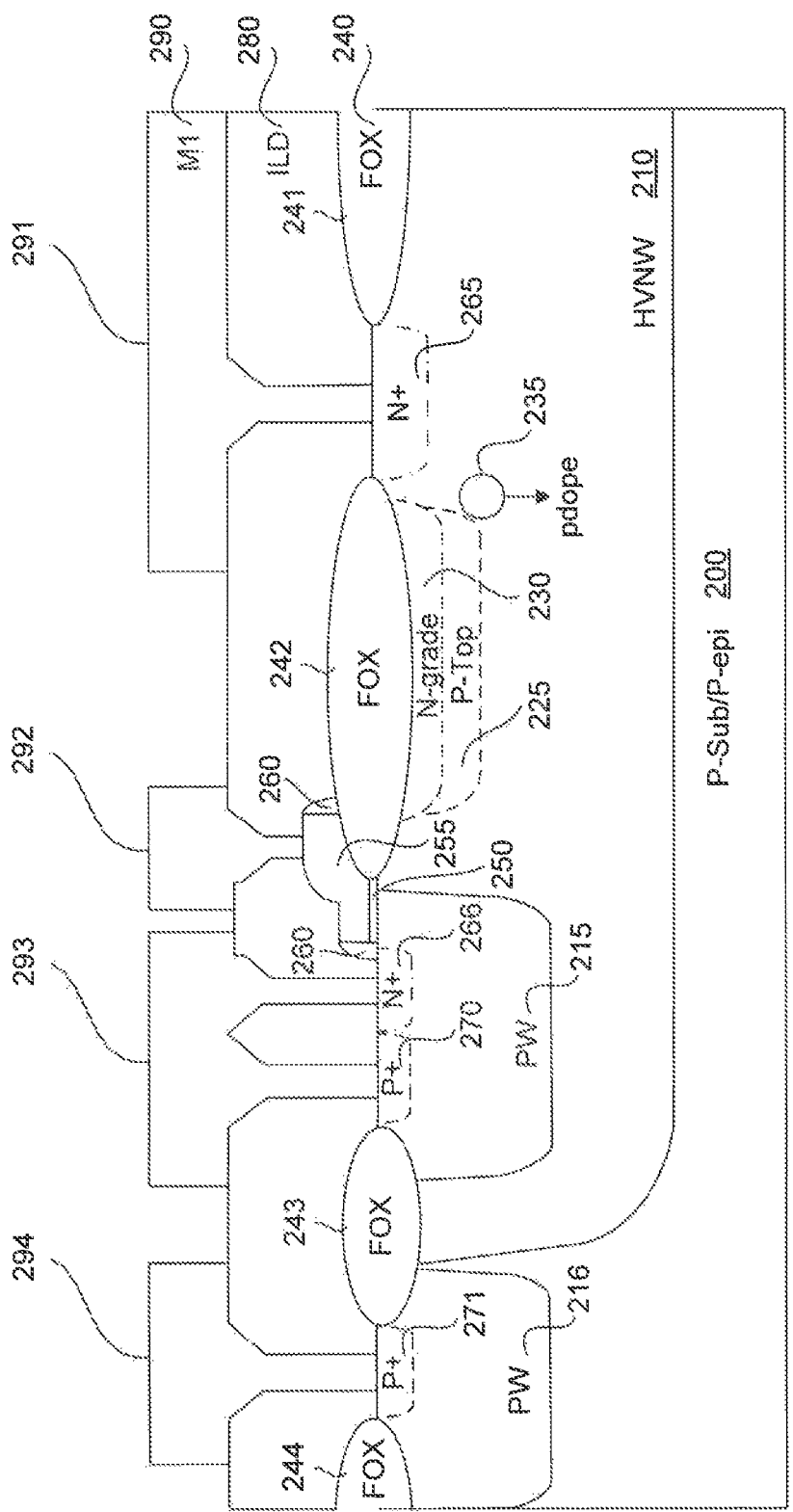

Referring to FIG. 2M, a contact layer (M1) 290 is formed above the structure of FIG. 2L. Contact layer 290 includes a first contact portion 291 that contacts first N+-region 265, a second contact portion 292 that contacts gate layer 255, a third contact portion 293 that contacts both second N+-region 266 and first P+-region 270, and a fourth contact portion 294 that contacts second P+-region 271. Contact layer 290 can be made of any electrically conductive metal, such as aluminum, copper, or an aluminum-copper alloy. Contact layer 290 is formed by a deposition process that deposits a metal layer, a photolithography process that defines regions where contact layer 290 is to be formed, and an etching process that removes the metal layer outside the defined regions.

Figure 3:
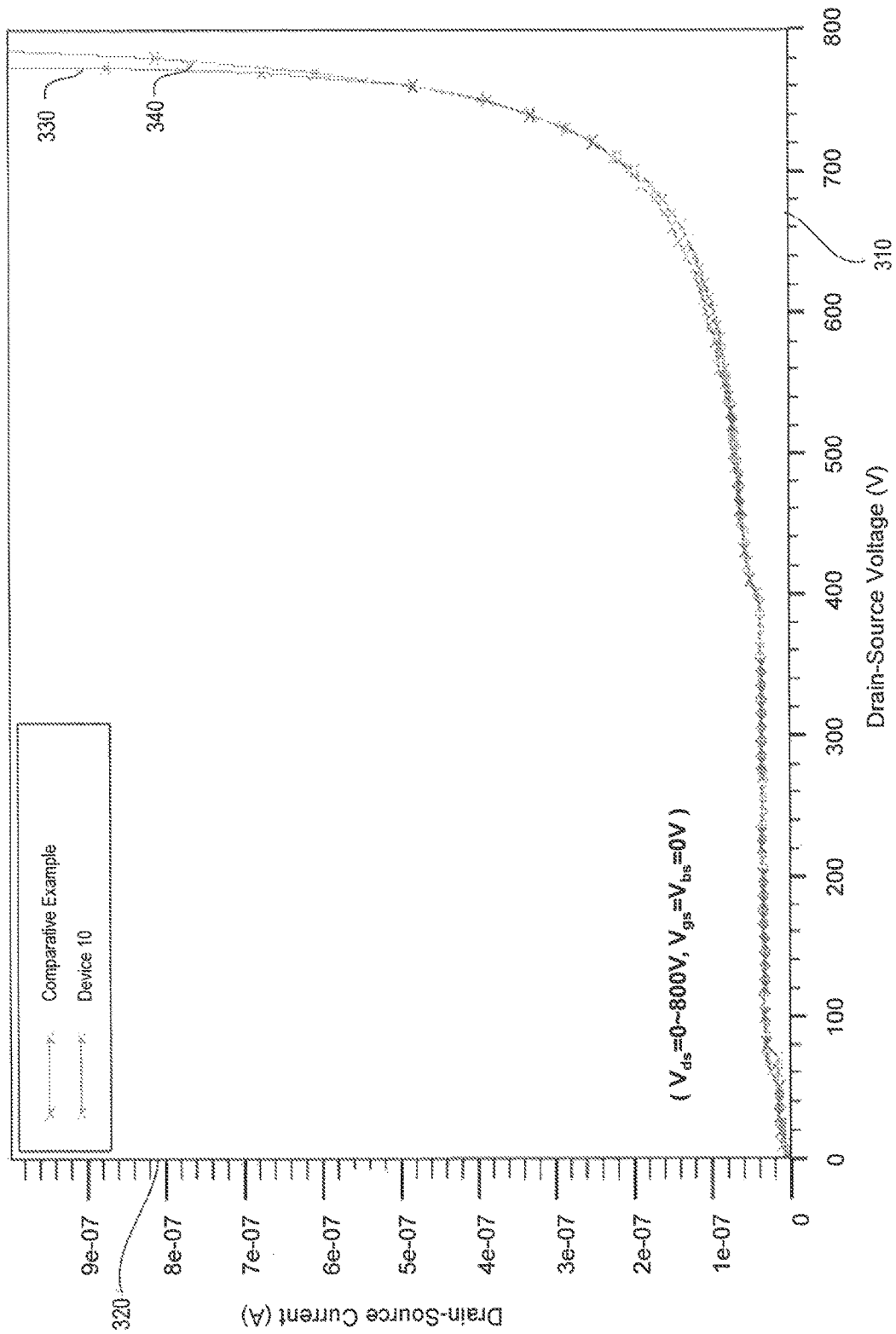
FIG. 3 is a graph showing drain characteristics of the device of FIG. 1, and of a device constructed as a comparative example.

FIG. 3 is a graph showing drain characteristics of device 10 having pdope region 135 as illustrated in FIG. 1, and of a device constructed as a comparative example. In the graph of FIG. 3, an abscissa 310 represents a drain-source voltage $V_{ds}$ (i.e., the voltage applied between first N+-region 165 as the drain region and second N+-region 166 and first P+-region 170 as the source region), and an ordinate 320 represents a drain-source current $I_{ds}$. Curve 330 represents the $V_{ds}$ vs. $I_{ds}$ characteristic of device 10, and curve 340 represents the $V_{ds}$ vs. $I_{ds}$ characteristic of the device of the comparative example. The device of the comparative example has a structure similar to that of device 10, except that the device of the comparative example does not include pdope region 135. In FIG. 3, the drain-source voltage $V_{ds}$, denoted on abscissa 310 as "Drain-Source Voltage (V)," varies from 0 to 800V, and a gate-source voltage $V_{gs}$ (i.e., the voltage applied between gate layer 155 and second N+-region 166 and first P+-region 170 as the source region) and a bulk-source voltage $V_{bs}$ (i.e., the voltage applied between second P+-region 171 as the bulk region and second N+-region 166 and first P+-region 170 as the source region) are maintained at 0V. As illustrated in FIG. 3, the off-breakdown voltage of both of device 10 and the device of the comparative example are above 700V. Therefore, device 10 has approximately the same off-breakdown voltage as that of the device of the comparative example.

Figure 4:
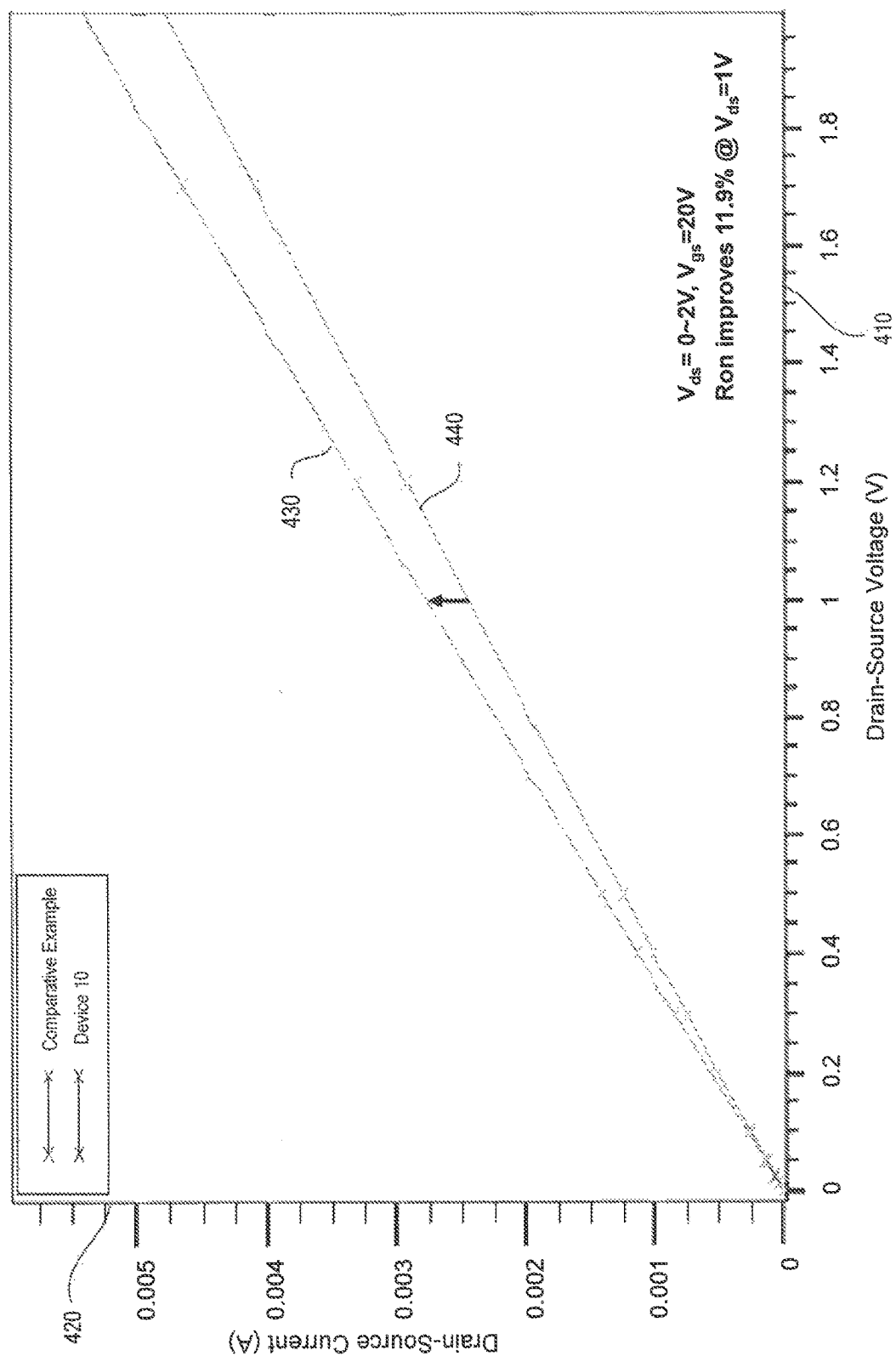
FIG. 4 is a graph showing the drain characteristics of the device of FIG. 1 and of the device constructed as the comparative example.

FIG. 4 is a graph showing the drain characteristics of device 10 and of the device of the comparative example. In the graph of FIG. 4, an abscissa 410 represents the drain-source voltage $V_{ds}$, and an ordinate 420 represents a drain-source current $I_{ds}$. Curve 430 represents the $V_{ds}$ vs. $I_{ds}$ characteristic of device 10, and curve 440 represents the $V_{ds}$ vs. $I_{ds}$ characteristic of the device of the comparative example. In FIG. 4, $V_{ds}$, again denoted on abscissa 410 as "Drain-Source Voltage (V)," varies from 0 to 2V, and $V_{gs}$ is maintained at 20V. As illustrated in FIG. 4, for the same value of $V_{ds}$ (e.g., 1V), a drain-source current $I_{ds}$, denoted on ordinate 420 as "Drain-Source Current (A)," of device 10 is higher than that of the device of the comparative example, and the specific on-resistance Ron of device 10 improves about 11.9% than that of the device of the comparative example. Therefore, device 10 has a lower specific on-resistance than that of the device of the comparative example, while having the same off-breakdown voltage as that of the device of the comparative example.

In device 10 illustrated in FIG. 1, the width and depth of pdope region 135 in HVNW 110 are variables determined in view of various design considerations.

Figure 5:
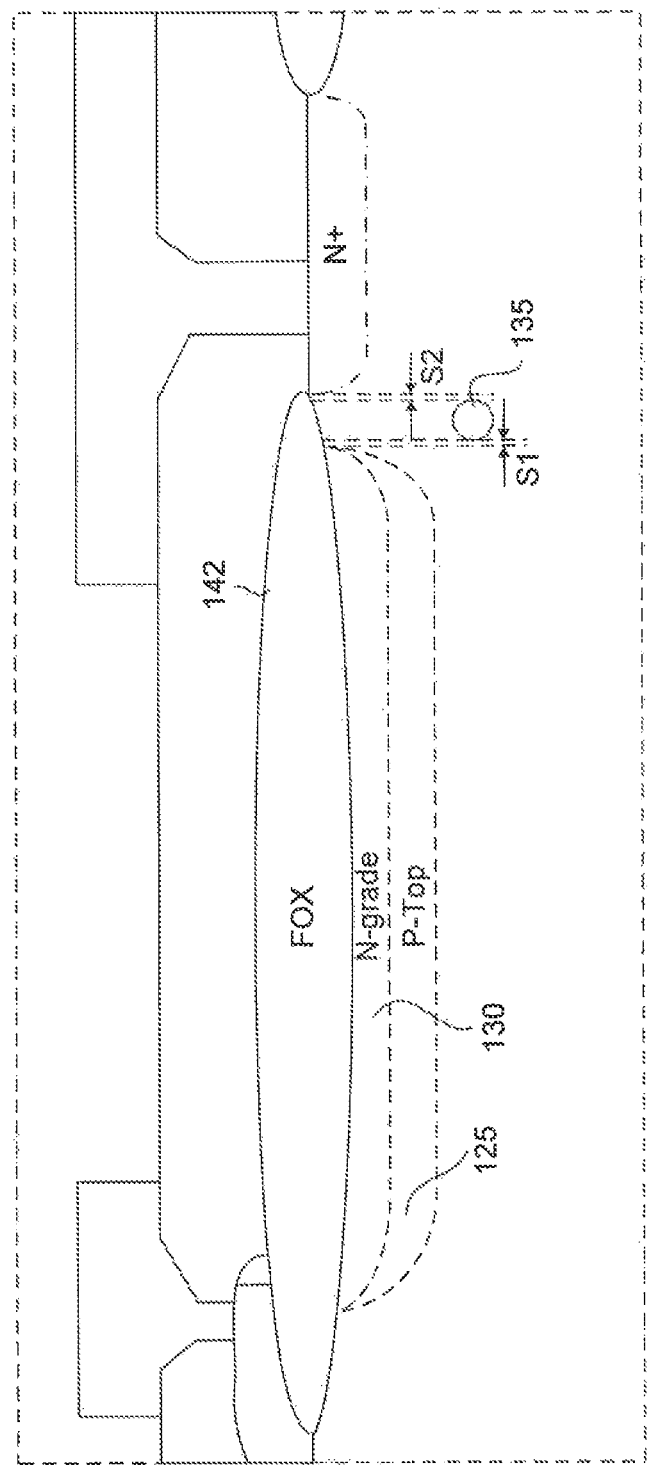
FIG. 5 schematically illustrates a partially enlarged cross-sectional view of a device, according to an illustrated embodiment.

FIG. 5 schematically illustrates a partially enlarged cross-sectional view of device 10, according to an illustrated embodiment. According to FIG. 5, the distance between the left-side edge of pdope region 135 and the right-side edge of P-top region 125 is defined as S1. The distance between the right-side edge of pdope region 135 and the right-side edge of second FOX portion 142 is defined as S2. Distances S1 and S2 are variables determined in view of various design considerations. In some embodiment, distances S1 and S2 can be arbitrary values that are positive, negative, or zero. That is, the left-side edge of pdope region 135 can be shrunk to not overlap with the right-side edge of P-top 125, or be extended to overlap with the right-side edge of P-top 125, or be vertically aligned with the right-side edge of P-top 125. In addition, the right-side edge of pdope region 135 can be shrunk into or extended outside or be vertically aligned with the right-side edge of second FOX portion 142. In addition, the width and depth of pdope region 135 are variables determined in view of various design considerations. In some embodiments, the upper-side edge of pdope region 135 is deeper than a bottom of drift region 120.

While the embodiment described above is directed to N-type LDMOS device 10 shown in FIG. 1 and fabrication methods thereof shown in FIGS. 2A-2M, those skilled in the art will now appreciate that the disclosed concepts are equally applicable to a P-type LDMOS device. Those skilled in the art will also appreciate that the disclosed concepts are applicable to other semiconductor devices and the fabrication methods thereof, such as insulated-gate bipolar transistor (IGBT) devices and diodes.

Figure 6:
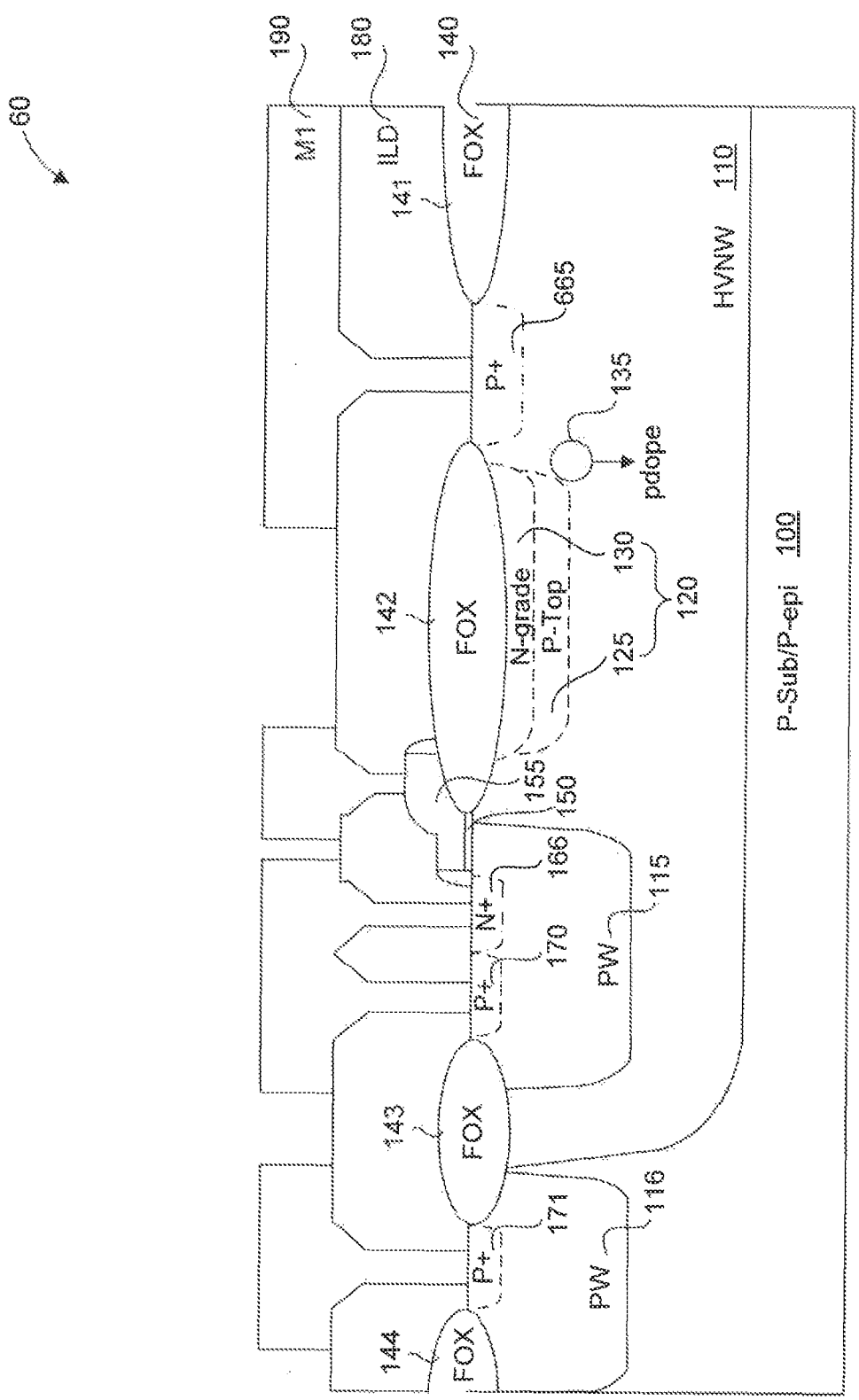
FIG. 6 schematically illustrates a cross-sectional view of an insulated gate bipolar transistor, according to an illustrated embodiment.

FIG. 6 schematically illustrates a cross-sectional view of an insulated gate bipolar transistor (IGBT) 60, according to an illustrated embodiment. IGBT 60 has a structure similar to that of device 10, except that first N+-region 165 is replaced with a P+-region 665 which constitutes a drain region of IGBT 60.

Figure 7:
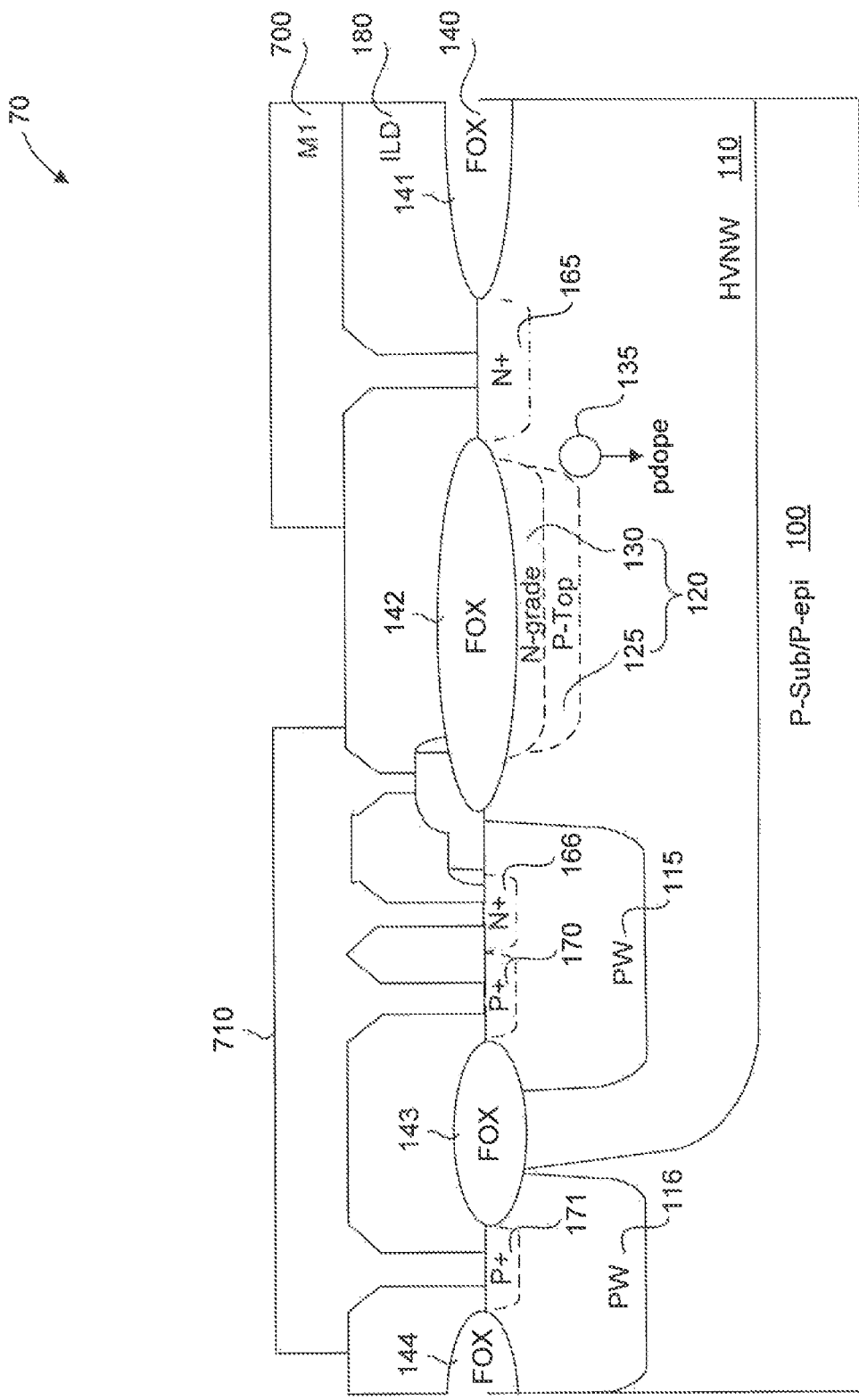
FIG. 7 schematically illustrates a cross-sectional view of an ultra-HV diode, according to an illustrated embodiment.

FIG. 7 schematically illustrates a cross-sectional view of an ultra-HV diode 70, according to an illustrated embodiment. Diode 70 has a structure similar to that of device 10, except that a contact layer 700 includes a contact portion 710 that conductively contacts second N+-region 166, first P+-region 170, and second P+-region 171.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device, comprising:
    a substrate having a first conductivity type;
    a high-voltage well having a second conductivity type and formed in the substrate;
    a source region formed in the high-voltage well;
    a drain region formed in the high-voltage well;
    a drift region formed in the high-voltage well between the source region and the drain region, and spaced apart from the source region and the drain region; and
    a buried region having the first conductivity type formed in the high-voltage well between the drift region and the drain region,
    wherein an upper-side edge of the buried region is deeper than a bottom of the drift region.

2. The semiconductor device of claim 1, wherein the first conductivity type is P-type and the second conductivity type is N-type, and
    the drift region includes:
        a P-type top region; and
        an N-type grade region formed on top of the P-type top region.

3. The semiconductor device of claim 1, wherein the first conductivity type is N-type and the second conductivity type is P-type.

4. The semiconductor device of claim 1, wherein the semiconductor device is a lateral diffused metal oxide semiconductor device, and the drain region has the second conductivity type.

5. The semiconductor device of claim 1, wherein the semiconductor device is an insulated gate bipolar transistor, and the drain region has the first conductivity type.

6. The semiconductor device of claim 1, wherein the semiconductor device is a diode.

7. The semiconductor device of claim 1, further including an insulation layer formed above the drift region,
    wherein the buried region is disposed to overlap with an edge portion of the insulation layer, and
    the buried region is disposed to overlap or not overlap with the drift region.

8. The semiconductor device of claim 1, further including:
    a source well having the first conductivity type and formed in the high-voltage well on a first side of the drift region opposite to a second side where the drain region is formed;
    wherein the source region is formed in the source well.

9. The semiconductor device of claim 8, further including:
    a gate oxide layer disposed above the substrate between the source region and the drain region; and
    a gate layer disposed above the gate oxide layer.

10. The semiconductor device of claim 1, further including:
    an interlayer dielectric layer disposed above the substrate; and
    a contact layer disposed above the interlayer dielectric layer.

11. A method for fabricating a semiconductor device, the method comprising:
    providing a substrate having a first conductivity type;
    forming a high-voltage well having a second conductivity type in the substrate;
    forming a source region in the high-voltage well;
    forming a drain region in the high-voltage well;
    forming a drift region in the high-voltage well between the source region and the drain region, and spaced apart from the source region and the drain region; and
    forming a buried region having the first conductivity type in the high-voltage well between the drift region and the drain region,
    wherein forming the buried region includes forming an upper-side edge of the buried region deeper than a bottom of the drift region.

12. The method of claim 11, wherein the first conductivity type is P-type and the second conductivity type is N-type.

13. The method of claim 11, wherein the first conductivity type is N-type and the second conductivity type is P-type.

14. The method of claim 11, wherein the semiconductor device is a lateral diffused metal oxide semiconductor device, and
    forming the drain region includes forming the drain region having the second conductivity type.

15. The method of claim 11, wherein the semiconductor device is an insulated gate bipolar transistor, and
    forming the drain region includes forming the drain region having the first conductivity type.

16. The method of claim 11, wherein forming the drift region includes:
    forming a top region having the first conductivity type in the high-voltage well; and
    forming a grade region having the second conductivity to be on top of the top region.

17. The method of claim 11, further including:
    forming a source well having the first conductivity type in the high-voltage well on a first side of the drift region opposite to a second side where the drain region is formed;
    wherein forming the source region in the high-voltage well includes forming the source region in the source well.

18. The method of claim 17, further including:
    forming a gate oxide layer above the substrate between the source region and the drain region; and
    forming a gate layer above the gate oxide layer.

19. The method of claim 11, further including:
    forming an interlayer dielectric layer above the substrate; and
    forming a contact layer above the interlayer dielectric layer.

20. The method of claim 11, wherein forming the buried region includes implanting a dopant having the first conductivity type into a defined region in the high-voltage well.

* * * * *